United States Patent
Ho et al.

(10) Patent No.: US 8,961,855 B2
(45) Date of Patent: Feb. 24, 2015

(54) HIGH ASPECT RATIO ADHESIVE STRUCTURE AND A METHOD OF FORMING THE SAME

(75) Inventors: Yoke Yee Audrey Ho, Singapore (SG); Isabel Rodriguez Fernandez, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 763 days.

(21) Appl. No.: 13/202,090

(22) PCT Filed: Feb. 12, 2010

(86) PCT No.: PCT/SG2010/000056
§ 371 (c)(1),
(2), (4) Date: Aug. 17, 2011

(87) PCT Pub. No.: WO2010/096023
PCT Pub. Date: Aug. 26, 2010

(65) Prior Publication Data
US 2011/0300339 A1   Dec. 8, 2011

Related U.S. Application Data

(60) Provisional application No. 61/153,134, filed on Feb. 17, 2009.

(51) Int. Cl.
*B29C 33/38* (2006.01)
*B29C 59/02* (2006.01)
(Continued)

(52) U.S. Cl.
CPC ............. *B29C 59/022* (2013.01); *B29C 39/026* (2013.01); *B29C 41/00* (2013.01); *B29C 2059/023* (2013.01); *B29C 33/3814* (2013.01); *B29C 2043/025* (2013.01); *B81B 2207/053* (2013.01); *B81C 1/00111* (2013.01);
(Continued)

(58) Field of Classification Search
USPC ........... 264/42, 219, 220, 221, 313, 317, 334; 216/103
See application file for complete search history.

(56) References Cited

U.S. PATENT DOCUMENTS 7,649,198 B2 *  1/2010  Chao et al. ...................... 257/40
7,887,736 B2 *  2/2011  Lee et al. ...................... 264/319
(Continued)

FOREIGN PATENT DOCUMENTS

| WO | WO 2005/065619 A1 | 7/2005 |
| WO | WO 2008/102621 A1 | 8/2008 |
| WO | WO 2009/117456 A2 | 9/2009 |

OTHER PUBLICATIONS

Lee et al. Fabrication of Hierarchical Structures on a Polymer Surface to Mimic Natural Superhydrophobic Surfaces. Adv. Mater. 2007, 19, 2330-2335.*
(Continued)

*Primary Examiner* — Atul P. Khare
(74) *Attorney, Agent, or Firm* — Blakely, Sokoloff, Taylor & Zafman LLP

(57) ABSTRACT

A method of forming a high aspect ratio adhesive structure, the method comprising fabricating a porous template comprising at least a first tier and a second tier; introducing a softened polymer into the template; and separating the polymer from the template.

14 Claims, 6 Drawing Sheets

(a)

(b)

(51) Int. Cl.
B29C 39/02 (2006.01)
B81C 1/00 (2006.01)
C09J 7/00 (2006.01)
B32B 3/30 (2006.01)
B29C 41/00 (2006.01)
B29C 43/02 (2006.01)

(52) U.S. Cl.
CPC .......... B81C2201/0183 (2013.01); C09J 7/00 (2013.01); C09J 2201/626 (2013.01)
USPC ............. 264/299; 264/42; 264/220; 264/221; 264/313; 264/317; 264/319; 264/334; 216/103

(56) References Cited

U.S. PATENT DOCUMENTS

2005/0271869 A1    12/2005  Jackson
2008/0116168 A1*   5/2008   Samper et al. .................. 216/41
2008/0252988 A1*  10/2008   Tormen et al. ................ 359/652

OTHER PUBLICATIONS

Greiner et al. Hierarchical Gecko-Like Adhesives. Adv. Mater. 2009, 21, 479-482.*
Zhang et al. Superhydrophobic Behavior of a Perfluoropolyether Lotus-Leaf-like Topography. Langmuir 2006, 22, 8576-8580.*
PCT International Search Report for PCT Counterpart Application No. PCT/SG2010/000056 containing Communication relating to the Results of the International Search Report, 5 pgs., (May 4, 2010).
PCT Written Opinion of the International Searching Authority for PCT Counterpart Application No. PCT/SG2010/000056, 7 pgs., (May 4, 2010).
PCT Written Opinion of the International Preliminary Examining Authority for PCT Counterpart Application No. PCT/SG2010/000056, 7 pgs., (Feb. 4, 2011).
Woo Kyung Cho, et al., "Fabrication of Hairy Polymeric Films Inspired by Geckos: Wetting and High Adhesion Properties", Advanced Functional Materials, vol. 18, pp. 1089-1096, (2008).
Seok Kim, et al., "Biologically Inspired Polymer Microfibers with Spatulate Tips as Repeatable Fibrillar Adhesives", Applied Physics Letters, vol. 89, No. 261911, 4 pgs., (2006).
J. Davies, et al., "A Practical Approach to the Development of a Synthetic Gecko Tape", International Journal of Adhesion & Adhesives, vol. 29, pp. 380-390, (2009).
Metin Sitti, "High Aspect Ratio Polymer Micro/Nano-Structure Manufacturing using Nanoembossing, Nanomolding and Directed Self-Assembly", Proceedings of the 2003 IEEE/ASME International Conference on Advanced Intelligent Mechatronics (AIM 2003), vol. 2, pp. 886-890, (2003).
Dong Sung Kim, et al., "Replication of High-Aspect-Ratio Nanopillar Array for Biomimetic Gecko Foot-Hair Prototype by UV Nano Embossing with Anodic Aluminum Oxide Mold", Microsyst. Technol., vol. 13, pp. 601-606, (2007).
Aranzazu Del Campo, et al., "Contact Shape Controls Adhesion of Bioinspired Fibrillar Surfaces", Langmuir, vol. 23, pp. 10235-10243, (2007).
Hoon Eui Jeong, et al., "High Aspect-Ratio Polymer Nanostructures by Tailored Capillarity and Adhesive Force", Colloids and Surfaces A: Physicochem. Eng. Aspects, vol. 313-314 pp. 359-364, (2008).
Tanu Suryadi Kustandi, et al., "Fabrication of a Gecko-Like Hierarchical Fibril Array using a Bonded Porous Alumina Template", Journal of Micromechanics and Microengineering, vol. 17, pp. N75-N81, (2007).
Michael P. Murphy, et al., "Enhanced Adhesion by Gecko-Inspired Hierarchical Fibrillar Adhesives", ACS Applied Materials & Interfaces, vol. 1, No. 4, pp. 840-855, (2009).
Metin Sitti, et al., "Synthetic Gecko Foot-Hair Micro/Nano-Structures as Dry Adhesives", Journal of Adhesion Science and Technology, vol. 18, No. 7, pp. 1055-1074, (2003).

* cited by examiner

HIGH ASPECT RATIO ADHESIVE STRUCTURE AND A METHOD OF FORMING THE SAME

CROSS-REFERENCE TO RELATED APPLICATIONS

This patent application is a U.S. National Phase application under 35 U.S.C. §371 of International Application No. PCT/SG2010/000056, filed Feb. 12, 2010, entitled A HIGH ASPECT RATIO ADHESIVE STRUCTURE AND A METHOD OF FORMING THE SAME, which claims priority to U.S. patent application No. 61/153,134, filed Feb. 17, 2009.

FIELD OF THE INVENTION

The invention relates to a high aspect ratio adhesive structure and a method of forming the same and particularly, though not exclusively, relates to forming a high aspect ratio adhesive structure mimicking setae on gecko footpads.

BACKGROUND

Geckos have specially adapted footpads on their feet, with each square millimeter of footpad containing about 14,000 foot hairs or setae. This provides them with remarkable adhesive capability, allowing them to adhere to most surfaces as a result of van der Waals interactions between the setae and a surface. Each seta has a diameter of about 5 micrometers and is tipped with between 100 and 1,000 terminal bristles or spatulae, with each spatula having a length of about 0.2 micrometers. Each foot hair thus has a hierarchical structure comprising a seta with multiple spatulae. Rigidity from the relatively thick setae fibrils and flexibility from the relatively fine spatulae fibrils provide excellent conformal contact between footpad and surface such that a gecko can support about eight times its own weight with just one toe on smooth glass.

As the adhesive capability of gecko footpads is achieved without requiring liquid or surface tension, it is desirable to develop a man-made surface mimicking the setae structure on gecko footpads having similar adhesive properties arising from the surface structure alone, so as to obtain a completely dry adhesive that does not leave any residue and can be reused. This will be especially useful in low load applications such as pick-and-place handling of delicate microchips, so as to avoid load deformation or damage due to contact with chemical adhesives.

Template-assisted fabrication, based on deposition or introduction of a desired material into arrays of micro- and nano-channels, is a method of forming one-dimensional micro- and nanostructures. Considerable efforts have been made in designing and controlling fabrication of templates for forming gecko-like micro/nanostructures, including electron beam lithography, intermediate film moulding or photolithographic methods followed by silicon micromachining to construct templates for casting or hot embossing polymeric structures.

Among potential templates, nano-porous anodic alumina (NPAA) has drawn attention because it provides a self-assembled array of relatively uniformly-sized parallel pores or channels with large depths, in large scale and low cost. Availability of NPAA films has triggered investigations into their utilization as templates or masks to fabricate various nanostructures including nanotubues, nanowires, nanoporous films and nanodot arrays for wide ranging applications such as catalysis, electronics, optics, and biosensing. It has been reported that low viscosity polymeric solutions were used to cast polymer in NPAA templates in attempts to fabricate nanofibrils. However, long solvent evaporation times (e.g. 24 hours) make this an unsuitable method for use in mass production. Furthermore, the long and thin nanotube fibrils are apt to bend, entangle or clump together especially during removal of the NPAA template by wet etching, thereby impairing adhesive efficacy. Attempts have also been made to produce hierarchical PMMA fibrils using bonded alumina membranes or intermediate film moulds. However, these methods are complex and time consuming as they require precise alignment of multiple layers of membranes or moulds and involve numerous fabrication steps.

SUMMARY OF THE INVENTION

According to a first exemplary aspect, there is provided a method of forming a high aspect ratio adhesive structure. The method comprises fabricating a porous template comprising at least a first tier and a second tier; introducing a softened polymer into the template; and separating the polymer from the template.

The polymer may be introduced into the template by capillary force or by nanoimprinting.

Fabricating the template may comprise creating a first plurality of pores in the template, the first plurality of pores forming the first tier of the template; and creating a second plurality of pores in the template, the second plurality of pores being created within the first plurality of pores, the second plurality of pores forming the second tier of the template.

Fabricating the template may further comprise creating a third plurality of pores in the template, the third plurality of pores being created within the second plurality of pores, the third plurality of pores forming a third tier of the template.

The template preferably comprises an aluminium substrate and fabricating the template preferably includes anodizing the aluminium substrate.

Separating the polymer from the template may comprise peeling the template away from the polymer after the polymer has cooled in the template.

According to a second exemplary aspect, there is provided a high aspect ratio adhesive structure obtained by the method of the first exemplary aspect.

The adhesive structure preferably comprises at least a first tier of pillars and a second tier of pillars, the second tier of pillars each having a smaller diameter than the first tier of pillars, the second tier of pillars being disposed on the first tier of pillars.

The adhesive structure may further comprise a third tier of pillars, the third tier of pillars each having a smaller diameter than the second tier of pillars, the third tier of pillars being disposed on the second tier of pillars.

According to a third exemplary aspect, there is provided an adhesive tape comprising the high aspect ratio adhesive structure of the second exemplary aspect.

BRIEF DESCRIPTION OF THE DRAWINGS

In order that the invention may be fully understood and readily put into practical effect there shall now be described by way of non-limitative example only exemplary embodiments of the present invention, the description being with reference to the accompanying illustrative drawings.

In the drawings:

FIG. 8 (b) is a schematic plan view of the experimental set-up of FIG. 8 (a)

DETAILED DESCRIPTION OF THE EXEMPLARY EMBODIMENTS

Exemplary embodiments of a high aspect ratio adhesive structure and a method of fabricating the same according to the present invention are described with reference to FIGS. 1 to 10.

Figure 1:
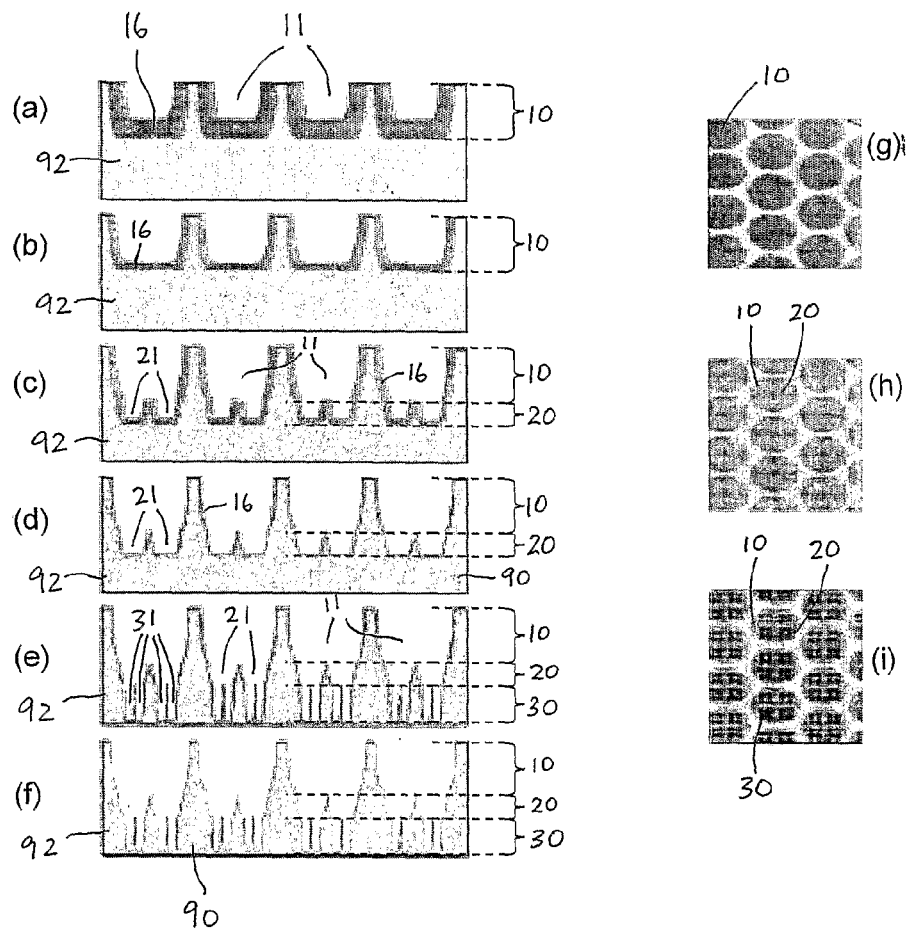
FIG. 1 is schematic cross-sectional side views and plan views of a template being fabricated by an exemplary embodiment of a method of forming an adhesive structure.
Figure 2:
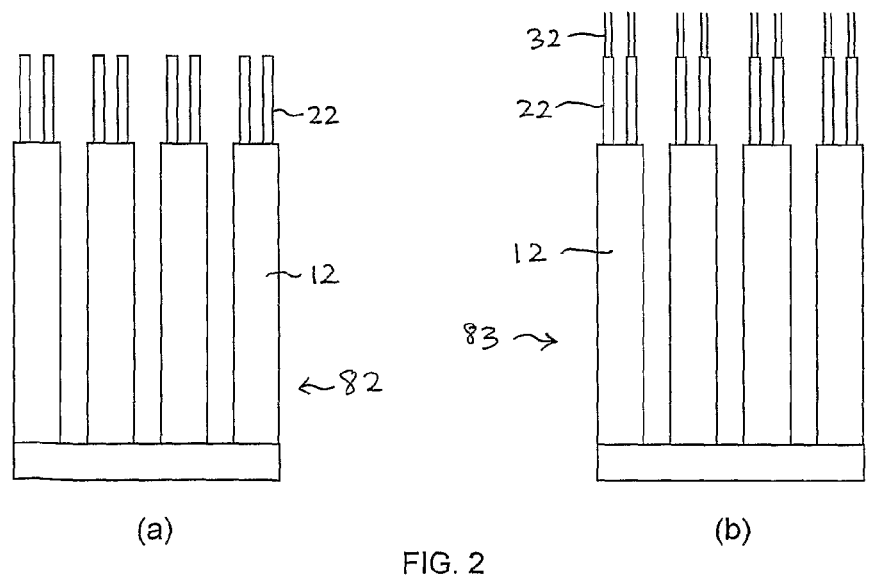
FIG. 2 is a schematic side view of exemplary adhesive structures according.
Figure 7:
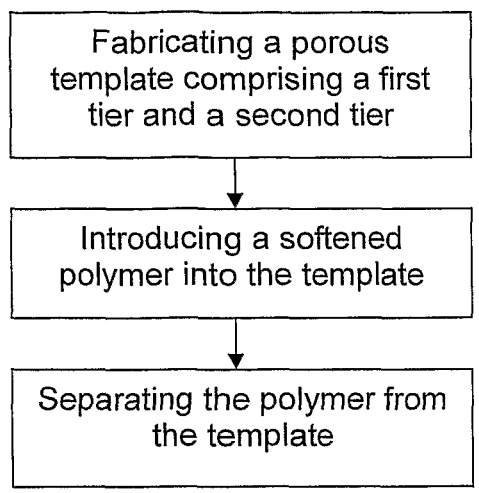
FIG. 7 is a flowchart of an exemplary method of fabricating an adhesive structure according to the present invention.
Figure 8:
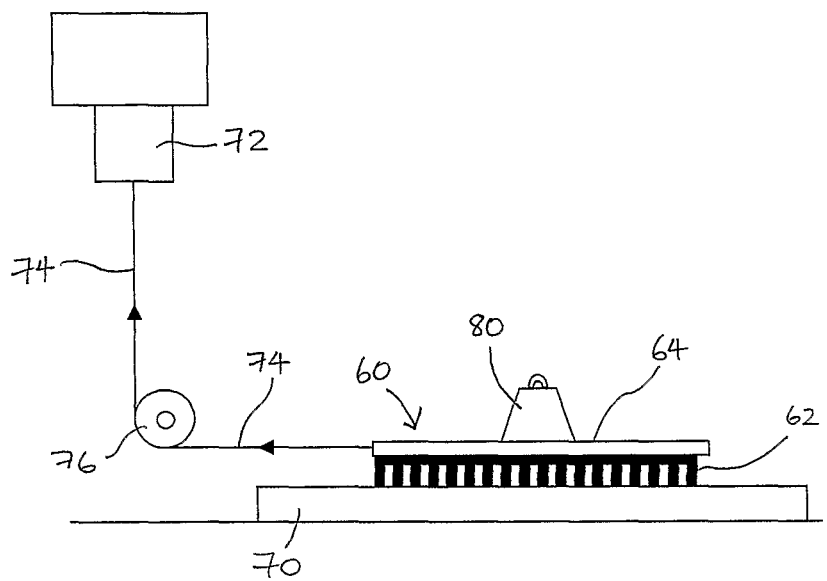
FIG. 8 (a) is a schematic side view of an experimental set-up for measuring frictional adhesion of an adhesive tape comprising an adhesive structure according to the present invention.
Figure 8:
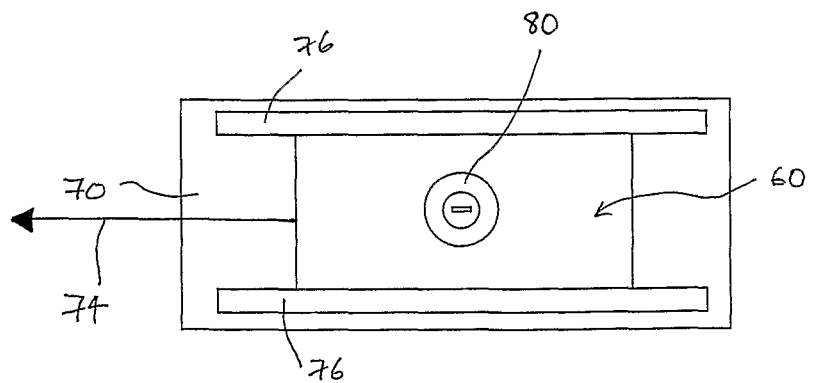

The method 100 of fabricating high aspect ratio adhesive structures 82, 83 as shown in FIG. 2 comprises first fabricating a tiered porous template 102 as given in the flowchart of FIG. 7. To do so, a commercially available aluminium sheet of 99.999% purity and 0.25 mm thick is first cut into substrates having a typical sample size of 20 mm×30 mm. The substrates are then electropolished for 4 minutes in a 1:4 mixture of 60% perchloric acid and ethanol, at a constant potential of 25 V and a temperature of 5° C. Edges of the substrates are insulated, for example with a polymer coating, to prevent excess charge formation at the edges, so that during subsequent anodization, non-homogeneous anodization across the substrates may be avoided.

During anodization, each substrate 92 is immersed in a thermally insulated anodization bath containing an electrolyte, with the anodization bath being placed on a cold plate to maintain a constant temperature. A platinum mesh acting as a counter electrode is then immersed into the electrolyte. Positive and negative terminals of a power supply are connected to the aluminium substrate 92 and platinum mesh respectively.

To form a first tier 10 of the porous template 90, as shown in FIG. 1(a), an aluminium substrate 92 is anodized for a first time in an electrolyte comprising a 1:10 mixture of 0.3 M $C_2H_2O_4$ acid and 0.3 M $H_3PO_4$ acid at a constant potential of 195 V and a temperature of 0° C. for 75 minutes. As a result of this first anodization, a first plurality of pores 11 is created on the aluminium substrate 92 of the template 90, each pore 11 having a pore depth of approximately 5 µm. A plan view of the template having a first tier 10 of pores 11 is shown in FIG. 1(g).

A barrier oxide layer 16 is also formed as a result of anodization. Thinning of the barrier layer 16 as shown in FIG. 1(b) is subsequently carried out by immersing the anodized substrate 92 in 5 wt % $H_3PO_4$ at room temperature for 330 minutes.

A second tier 20 of the porous template 90 is formed by anodizing the substrate 92 for a second time at 140 V in an electrolyte comprising a 1:1.5 mixture of 0.3 M $C_2H_4$ acid and 0.3 M $H_3PO_4$ acid at a temperature of 0° C. for 9 minutes, as shown in FIG. 1(c). As a result of this second anodization, a second plurality of pores 21 is created within the first plurality of pores 11 on the aluminium substrate 92 of the template 90. The second tier 20 is thus integral with the first tier 10 in the porous template 90. A plan view of the template 90 having a first tier 10 and a second tier 20 of pores 11, 21 respectively can be seen in FIG. 1(h).

The anodizing current dropped from a high current upon first turning on the power to stabilize after 30 seconds at around 9 mA during creation of the first tier 10 of the porous template 90. A subsequent increase in current thus signalled creation of the second tier 20. Anodization was further continued for 3 minutes in order for the desired pore depth of the second tier 20 to be reached, thereby forming a desired branched or tiered nano-porous anodic alumina (NPAA) template 90.

Subsequent pore-widening by thinning the barrier layer 16 as shown in FIG. 1(d) was performed for 60 minutes using the same barrier layer thinning solution of 5 wt % $H_3PO_4$.

A third tier 30 of the porous template 90 can be obtained by anodizing the substrate 92 a third time in 0.3 M $C_2H_2O_4$ at 50 V for 15 minutes in order to create a third plurality of pores 31 within the second plurality of pores 21 in the template 90, as shown in FIG. 1(e). The third tier 30 is thus integral with the second tier 20 of the porous template 90. A plan view of the template 90 having a first tier 10, a second tier 20, and a third tier 30 of pores 11, 21, 31 respectively can be seen in FIG. 1(i). Similarly, thinning of the barrier layer 16 as shown in FIG. 1(f) is carried out for 40 minutes.

Each tiered or branched NPAA template 90 fabricated as described above is thus of a single or integral piece, having tiers of plurality of pores integrally formed therein. The porous template 90 can subsequently be transformed into a hard nickel mould by techniques of electroplating.

Figure 3:
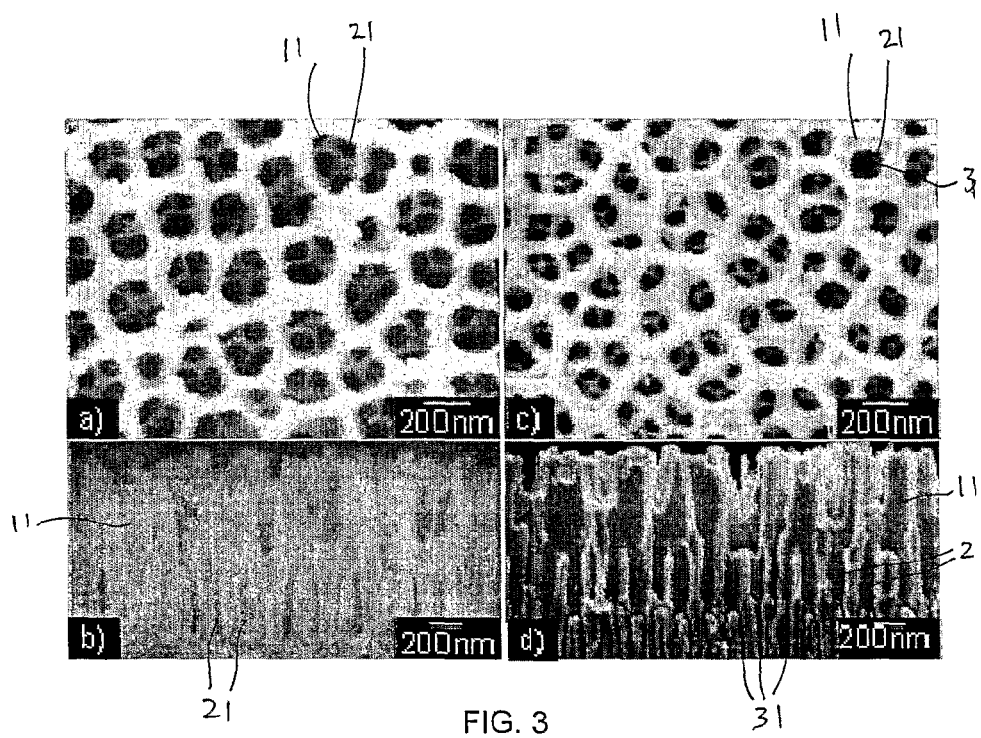
FIG. 3 is a collage of scanning electron micrographs of templates fabricated by an exemplary embodiment of a method of forming an adhesive structure.

FIGS. 3(a) and (b) show a top and cross-sectional view of a two-tiered branched NPAA template respectively. FIGS. 3 (c) and (d) show a top and cross-sectional view of a three-tiered branched NPAA respectively. The top view micrographs FIGS. 3(a) and 3(c) show a network structure of pores 21, 31 within pores 11, 21 respectively on a thin film substrate, while the cross-sectional view micrographs FIGS. 3(b) and 3(d) show pores 11, 21, 31 normal to the film's surface, with branching of sub-pores 21, 31 from preceding pores 11, 21 respectively.

After fabricating the tiered porous template 90, a viscous polymer is introduced into the template 90, 104 in order to form tiered or branched high aspect ratio polymeric pillars or fibrils for high conformal surface contact. By introducing a softened polymer into the template instead of solution casting, higher molecular weight polymers having superior mechanical properties can be used to form the high aspect ratio tiered pillars required for good adhesion. To do so, a polycarbonate (PC) sheet with a thickness between 20 microns to 1 mm, preferably 0.1 mm, is placed in contact with a tiered branched NPAA template 90 that is fabricated as described above. By applying a slight contact pressure and increasing the temperature well above the glass transition temperature of the polymer, the viscous, softened polymer enters the pores 11, 21, 31 of the template 90 by capillary action for a duration ranging from 10 minutes to 40 minutes.

The duration of introducing the polymer into the template 90 depends on the aspect ratio (height/width) of the pores 11, 21, 31 in the template 90 as well as the pore size, i.e., the height or thickness of the various tiers 10, 20, 30. The polymer in the template 90 is then cooled to approximately 40° C. before separating the polymer and the template 90, 106.

Separating the polymer and the template 90 is preferably performed by simply peeling off the template 90 from the cooled polymer, thereby minimizing clumping or matting of the tiered pillars formed. This is readily performed for templates 90 having a tier 10, 20, 30 height or thickness of about 2.5 µm. For templates 90 having a greater tier 10, 20, height or thicknesses, for example about 5.5 µm or about 10 µm, separating the polymer and the template 90 may alternatively be performed by removal of the template 90 by first etching off the bulk aluminium of the substrate 92 of the template 90 using a 1:1 mixture of 20 wt % HCl acid and 0.3 M $CuSO_4$, and subsequently etching off any remaining alumina or barrier layer 16 using 1 M KOH.

After separation of the polymer and the template 90, a dry adhesive tape comprising a polymer film having high aspect ratio high density of branched nano-pillars is obtained. Various samples of adhesive structures of different dimensions were formed using the method described above, according to parameters given in Table 1 below.

TABLE 1

| Samples-templates (Var. Thickness) | Imprinting Temp. [° C.] | Chamber Vacuum [mbar] | Tool Pressure [mbar] | Duration [min] | Template Removal Method |
|---|---|---|---|---|---|
| ~2.5 µm | 160 | $8.0 \times 10^{-3}$ | 500 | 40 | Peel Off |
| ~5.5 µm | 180 | $8.0 \times 10^{-3}$ | 500 | 40 | Etched Off |
| ~10 µm | 200 | $8.0 \times 10^{-3}$ | 500 | 40 | Etched Off |

Figure 4:
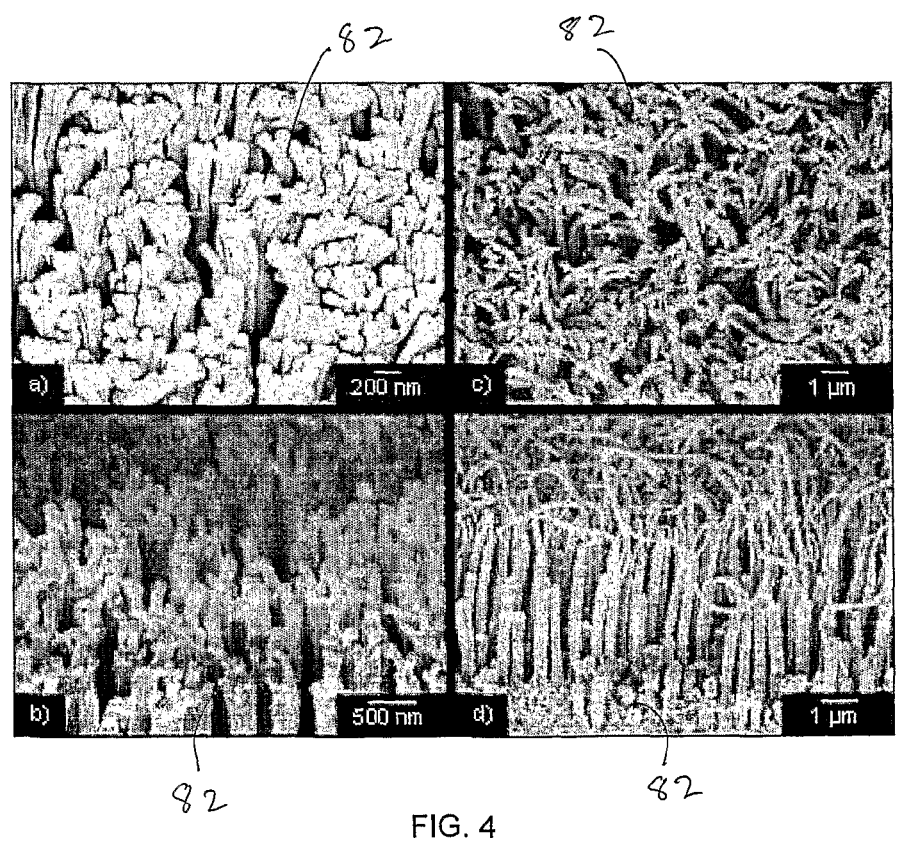
FIG. 4 is a collage of scanning electron micrographs of exemplary adhesive structures.

FIG. 4 provides oblique views of 2-tier high aspect ratio adhesive structures 82 comprising polymeric branched gecko-like pillars obtained after separating the cooled polymer from a two-tier template 90. The high aspect ratio adhesive structure 82 has an integral two-tier pillar structure comprising a first tier 12 of pillars and a second tier 22 of pillars or branches disposed on the first tier 12 of pillars. The first tier 12 is replicated from the first plurality of pores 11 in the template 90 while the second tier 22 is replicated from the second plurality of pores 21 in the template 90. A schematic side view of the adhesive structures of FIG. 4 is shown in FIG. 2(a). The second tier 22 of pillars each have a smaller diameter than the first tier 12 of pillars.

In FIG. 4(a), the adhesive structure 82 comprises a first tier of pillars having a dimension of about 2.5 µm in height and 350 nm in width with branches or a second tier of pillars of about 600 nm in height and 200 nm in width disposed thereon. FIG. 4(b) shows an adhesive structure 82 having a first tier of pillars of about 2.5 µm in height and 300 nm in width and a second tier of pillars or branches of about 300 nm in height and 100 nm in width. FIG. 4(c) shows a first tier of pillars of about 6.5 µm in height and 320 nm in width with branches or a second tier of pillars of about 750 nm in height and 100 nm in width, while FIG. 4(d) shows a first tier of pillars of about 2.5 µm in height and 300 nm in width with branches or a second tier of pillars of about 3.5 µm in height and 120 nm in width. Centre-to-centre distance between the first tier of pillars is approximately 500 nm.

FIG. 2(b) shows a schematic side view of a three-tier adhesive structure that can be obtained using a three-tier template.

By having a high density of high aspect ratio tiered or branched pillars, the adhesive structures 82, 83 thus achieve high conformal surface contact when placed against a surface, thereby achieving good adhesive properties.

Figure 5:
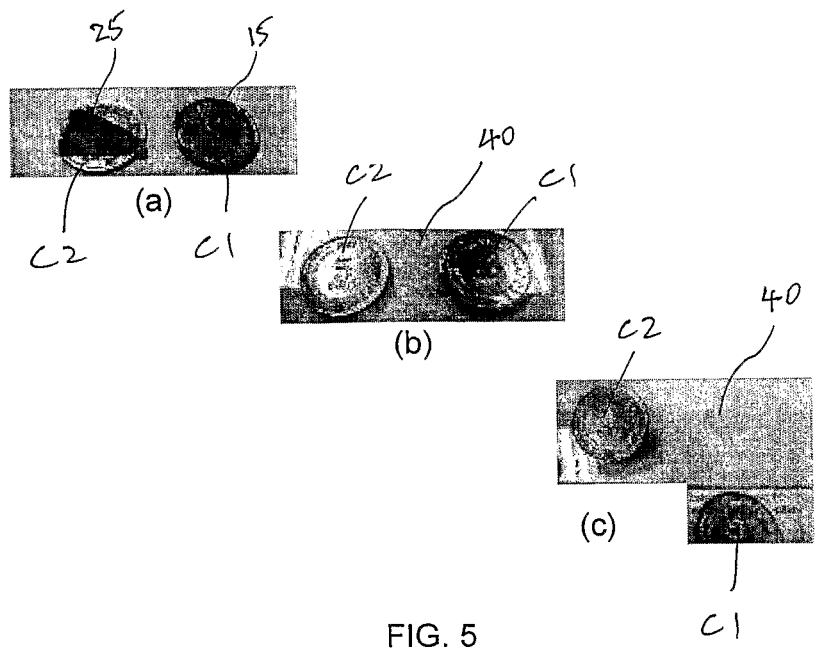
FIG. 5 is a sequence of photographs comparing use of an exemplary adhesive structure with another structure.

A demonstration of the adhesive properties of polymeric branched nanostructures formed according to the present invention is shown in FIG. 5. As shown in FIG. 5(a), a replicated PC film having branched nano-pillars (i.e. a two-tier pillar structure) 25 and a replicated PC film having linear nano-pillars (i.e. a single-tier pillar structure) 15 were each adhered to a Singaporean 5-cent coin (C2 and C1 respectively) using silicone glue, with the nano-pillars facing away from the coins. The replicated branched nanopillars had first-tier pillars of about 2 µm in height and 300 nm in width and second-tier pillars of about 0.5 µm in height and 100 nm in width (second tier), with an average aspect ratio of about 10:1. The replicated linear nanopillars were about 2.5 µm in height with an aspect ratio of about 10:1. The silicone glue was left to set for an hour. A new glass slide was cleaned with acetone, rinsed with ethanol and subsequently with deionized water before being blown dry with nitrogen. Both coins were placed on the glass slide 40 with the nano-pillars in contact with the glass slide as shown in FIG. 5(b). The glass slide was then tilted until one of the coins slid off. As shown in FIG. 5(c), the coin C1 with linear nano-pillars slid off the glass slide 40 first whereas the coin C2 with branched nano-pillars remained adhered to the slide 40.

Figure 6:
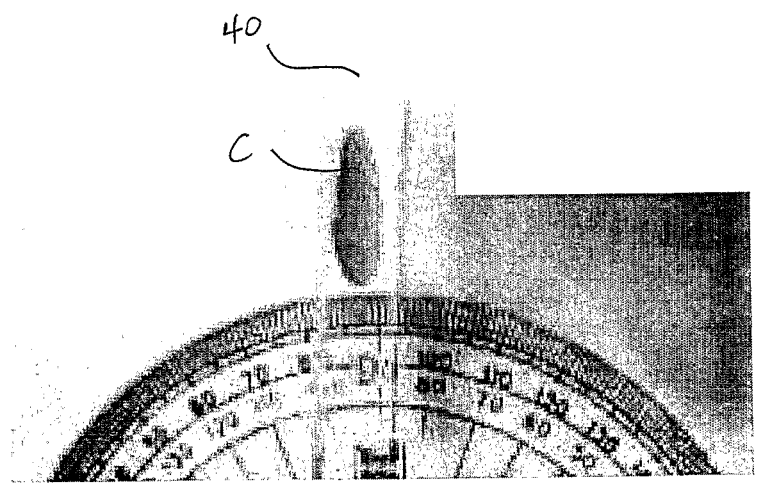
FIG. 6 is a photograph of use of an exemplary adhesive structure.

A further demonstration of the adhesive capability of the polymeric branched nanostructures formed according to the present invention is shown in FIG. 6, wherein a replicated PC film having first-tier pillars of about 2.5 µm in height and 300 nm in width and second-tier pillars or branches of about 300 nm in height and 100 nm in width can be seen to adhere a 5-cent coin C to a glass slide 40 held at an angle of about 90°.

To determine the frictional adhesion force of an adhesive tape comprising the high aspect ratio adhesive structures of the present invention, 1×1 $cm^2$ test samples 60 were prepared and tested against a glass surface 70 using a universal mechanical testing machine as shown in FIGS. 5 (a) and (b). Each sample comprised a PC film 62 having nano-pillars formed according to the exemplary method described above, and affixed to a relatively flat surface of a planar test substrate 64 using conventional double-sided adhesive tape (not shown), such that the nano-pillars faced away from the test substrate 64. Each test sample 60 was then placed face down on a horizontally oriented glass surface 70 with the nano-pillars in contact with the glass 70. A weight 80 of 3 g or 30 mN was placed on top of the test sample 60 to load the PC film 62 against the glass 70. The sample 60 was attached to a 2.5 N load cell 72 of the universal testing machine via a thin copper wire 74 having a diameter of about 30 µm. As the test sample 60 and glass surface 70 were horizontally oriented, the thin copper wire 74 was passed through a PTFE pulley 76 before attachment to the vertically oriented load cell 72. Linear guides 76 comprising PTFE tape were positioned with a gap width of 0.5 mm on either side of the test sample 60 to constrain the test sample 60 to only linear motion against the glass 70.

The test for each test sample 60 was then run by raising the load cell 72 at a displacement rate of 5 mm/min, thereby pulling on the copper wire 74 and shearing the test sample 60 against the glass 70. In this way, the frictional shear adhesion force of the test sample 60 against the glass 70 could be determined as being proportional to the tensile force sensed by the load cell 72 during raising of the load cell 72.

Test samples 60 comprising single-tier or linear pillar structures of about 2 µm in height and 200 nm were prepared and tested. Test samples 60 comprising double-tier or branched pillar structures with first tier pillars of about 2 μm in height and 200 nm were similarly prepared and tested. In addition, a control sample comprising a pristine PC film without any pillar structures was prepared and tested.

Figure 9:
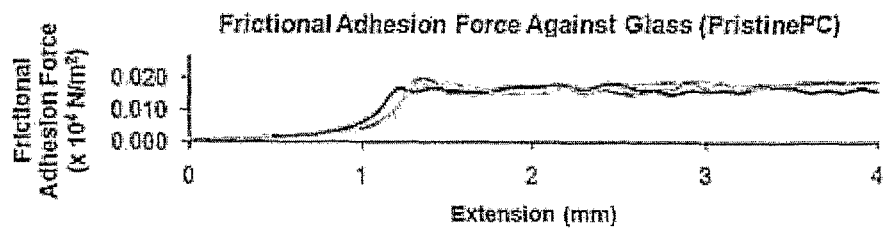
FIG. 9 is a graph of the frictional adhesion force of the adhesive tape of FIG. 8 against glass.
Figure 10:
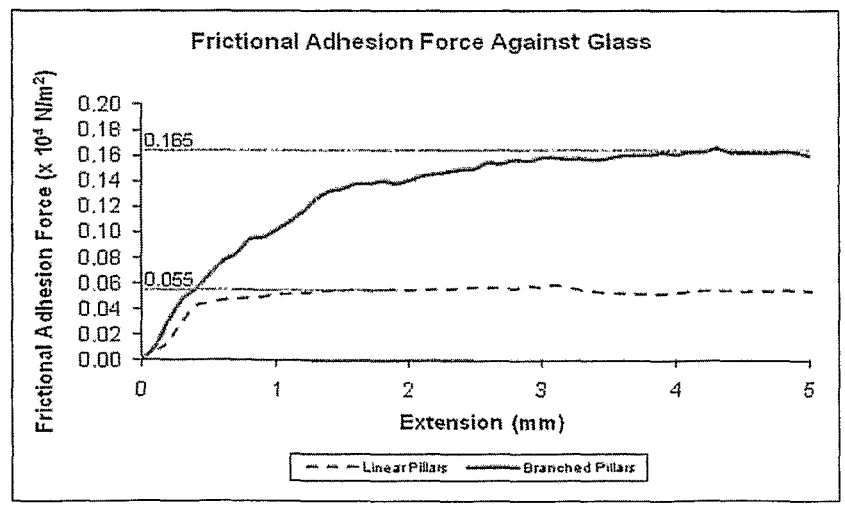
FIG. 10 is a graph of the frictional adhesion force for branched pillars and linear pillars.

FIG. 9 shows the frictional shear adhesion force for the control sample to be about $1.5 \times 10^2$ N/m$^2$. FIG. 10 shows the frictional shear adhesion force for PC films 62 having linear pillar structures 66 and branched pillar structures 68. As can be seen in FIG. 10, linear pillar structures 68 achieved frictional adhesive forces of about $5.5 \times 10^2$ N/m$^2$, which is more than three times greater than that of a pristine PC film. Branched pillar structures 68 achieved maximum frictional adhesion values of about $16.5 \times 10^2$ N/m$^2$, which is three times the frictional force achieved by linear pillar structures 66 or more than ten times greater than that of a pristine PC film.

The tests therefore demonstrate a significant increase in adhesive performance provided by branched pillar structures 68 compared to linear pillar structures 66. This can be attributed to the fact that branched pillar structures 68 provide a more effective and greater number of close-proximity contact points with a surface than similarly-sized linear pillars 66 of the same aspect ratio. Branched pillar structures thus conform better to a surface to enhance adhesion to the surface. It is therefore important for adhesive tapes comprising adhesive pillar structures to have high density and high aspect ratio nanometer scale-sized pillar structures, as provided and demonstrated by the double tier or branched nano-pillars, so as to enhance the adhesive properties of such adhesive tapes.

Whilst there has been described in the foregoing description exemplary embodiments of the present invention, it will be understood by those skilled in the technology concerned that many variations in details of design, construction and/or operation may be made without departing from the present invention. For example, other than by capillary force as described above, the softened polymer may be introduced into the tiered template by nanoimprinting.

What is claimed is:

1. A method of forming a high aspect ratio adhesive structure, the method comprising:
   fabricating a porous template to have a first, second, and third plurality of pores created by successive anodization forming first, second, and third template tiers respectively, a plurality of the second plurality of pores being created within each of the first plurality of pores, and a plurality of the third plurality of pores being created within each of the second plurality of pores, wherein the porous template thus fabricated is of an integral piece having said tiers of pluralities of pores integrally formed therein;
   introducing a softened polymer into the template so as to conform with each of the pluralities of pores; and
   separating the polymer from the template as the adhesive structure, the adhesive structure replicating the first, second, and third tiers of the first, second, and third plurality of pores respectively.

2. The method of claim 1, wherein said separating comprises etching bulk template aluminum and any remaining template alumina.

3. The method of claim 1, wherein the adhesive structure comprises a first tier of pillars, a second tier of pillars disposed on the first tier of pillars and having a smaller diameter than the first tier of pillars, and a third tier of pillars disposed on the second tier of pillars and having a smaller diameter than the second tier of pillars.

4. The method of claim 1, wherein the template is insulated with polymer coating during said anodization.

5. The method of claim 1, wherein said anodization forming the first template tier is conducted in an electrolyte comprising a 1:10 mixture of 0.3 M $C_2H_2O_4$ acid and 0.3 M $H_3PO_4$ acid at a constant potential of 195 V and a temperature of 0° C. for 75 minutes.

6. The method of claim 1, wherein the polymer is introduced into the template by capillary force.

7. The method of claim 1, wherein the polymer is introduced into the template by nanoimprinting.

8. The method of claim 1, wherein the template comprises an aluminium substrate and said fabricating is conducted by anodizing the aluminium substrate.

9. The method of claim 1, wherein said separating comprises peeling the template away from the polymer after the polymer has cooled in the template.

10. The method of claim 1, wherein a duration for said introducing is determined based on pore aspect ratio, pore size, and tier height or thickness.

11. The method of claim 1, wherein the template is nanoporous and the adhesive structure is a dry adhesive tape having high aspect ratio high density branched nano-pillars.

12. The method of claim 5, wherein said anodization forming the second template tier is conducted in an electrolyte comprising a 1:1.5 mixture of 0.3 M $C_2H_4$ acid and 0.3 M $H_3PO_4$ acid at 140 V and a temperature of 0° C. for 9 minutes.

13. The method of claim 12, wherein said anodization forming the third template tier is conducted in 0.3 M $C_2H_2O_4$ at 50 V for 15 minutes.

14. The method of claim 13, wherein a barrier oxide layer formed as a result of each anodization is thinned between each anodization.

* * * * *